US006789148B1

(12) United States Patent
Hinds

(10) Patent No.: US 6,789,148 B1
(45) Date of Patent: Sep. 7, 2004

(54) SINGLE EXTENDER CARD METHOD AND SYSTEM FOR TROUBLESHOOTING A PERSONAL COMPUTER

(75) Inventor: Robert Dean Hinds, Mechanicsville, IA (US)

(73) Assignee: Crystal Group Inc., Hiawatha, IA (US)

(*) Notice: Subject to any disclaimer, the term of this patent is extended or adjusted under 35 U.S.C. 154(b) by 524 days.

(21) Appl. No.: 09/588,518

(22) Filed: Jun. 6, 2000

(51) Int. Cl.[7] .............................................. G06F 3/00
(52) U.S. Cl. .................. 710/300; 710/301; 710/62; 710/63; 710/72; 439/59; 361/686
(58) Field of Search ................. 710/300–304, 710/305–307, 314, 315, 62–64, 72; 439/59–60, 633, 951, 680, 659; 361/686, 684, 803, 788, 683

(56) References Cited

U.S. PATENT DOCUMENTS

| | | | | |
|---|---|---|---|---|
| 5,530,887 A | * | 6/1996 | Harper et al. ................. | 710/62 |
| 5,628,637 A | * | 5/1997 | Pecone et al. ................. | 710/62 |
| 5,852,725 A | * | 12/1998 | Yen ............................. | 710/302 |
| 5,961,352 A | * | 10/1999 | Denny et al. ................ | 439/637 |
| 5,961,618 A | * | 10/1999 | Kim ............................ | 710/101 |
| 6,146,150 A | * | 11/2000 | Roberts ....................... | 439/55 |
| 6,147,863 A | * | 11/2000 | Moore et al. ................ | 361/686 |
| 6,179,664 B1 | * | 1/2001 | Tung et al. .................. | 439/633 |
| 6,301,104 B1 | * | 10/2001 | Hu .............................. | 361/684 |
| 6,351,719 B1 | * | 2/2002 | Harenza et al. ............. | 702/118 |
| 6,496,376 B1 | * | 12/2002 | Plunkett et al. ............. | 361/729 |
| 6,567,870 B1 | * | 5/2003 | Thomas ....................... | 710/62 |

* cited by examiner

Primary Examiner—Paul R. Myers
Assistant Examiner—Raymond N Phan
(74) Attorney, Agent, or Firm—Simmons, Perrine, Albright & Ellwood, PLC

(57) ABSTRACT

A system and method for repairing a PC where an extender card with both ISA and PCI buss connections is used to elevate the motherboard during troubleshooting operations, the extender card includes imbedded thereon, current-measurement stations to aid in efficient assessment of current flow through portions of the motherboard.

24 Claims, 2 Drawing Sheets

SINGLE EXTENDER CARD METHOD AND SYSTEM FOR TROUBLESHOOTING A PERSONAL COMPUTER

FIELD OF THE INVENTION

The present invention generally relates to computers, and more particularly relates to personal computers, and even more particularly relates to methods and systems for troubleshooting personal computers.

BACKGROUND OF THE INVENTION

In recent years, industrial personal computers have become increasingly prevalent in many industries. It is not uncommon today to see rows of industrial PCs arranged in racks. While many of these industrial PCs are often designed and manufactured to higher standards than consumer PCs, they still are occasionally in need of repair. Typically, when a repair is needed, the PC is removed from the rack, taken to a computer repair facility, and partially dismantled. Depending upon the layout of the PC, the motherboard may be removed or otherwise made available for inspection and remedial action. However, in many PCs, the motherboard is difficult to access, and it may require the removal of other circuit cards around it to permit access to the motherboard. In the past, PC engineers have devised extender cards which couple with an ISA or PCI bus in the PC, and physically elevate the card under test above the other cards within the PC so they can be accessed while still electrically coupled to the remainder of the PC.

While these extender cards have been used extensively in the past, they do have some drawbacks. First of all, some modern motherboards include PICMG cards, which have both ISA and PCI bus connections thereon. The individual prior art ISA extender cards and the prior art PCI extender cards could be cobbled together to provide a makeshift extender card. However, the use of two cards is unwieldy and time consuming.

Consequently, there exists a need for improved methods and systems for repairing personal computers in an efficient manner.

SUMMARY OF THE INVENTION

It is an object of the present invention to provide a system and method for repairing a personal computer in an efficient manner.

It is a feature of the present invention to utilize a single extender card having both ISA and PCI bus connections thereon.

It is another feature of the present invention to include current measuring devices on the extender card.

It is an advantage of the present invention to achieve improved efficiency in repairing personal computers.

The present invention is an apparatus and method for repairing personal computers designed to satisfy the aforementioned needs, provide the previously stated objects, include the above-listed features, and achieve the already articulated advantages. The present invention is carried out in a "wasted time-less" manner in a sense that the time consumed with troubleshooting a PC has been greatly reduced.

Accordingly, the present invention is a system and method including a single extender card having both ISA and PCI bus connections and current measuring devices.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
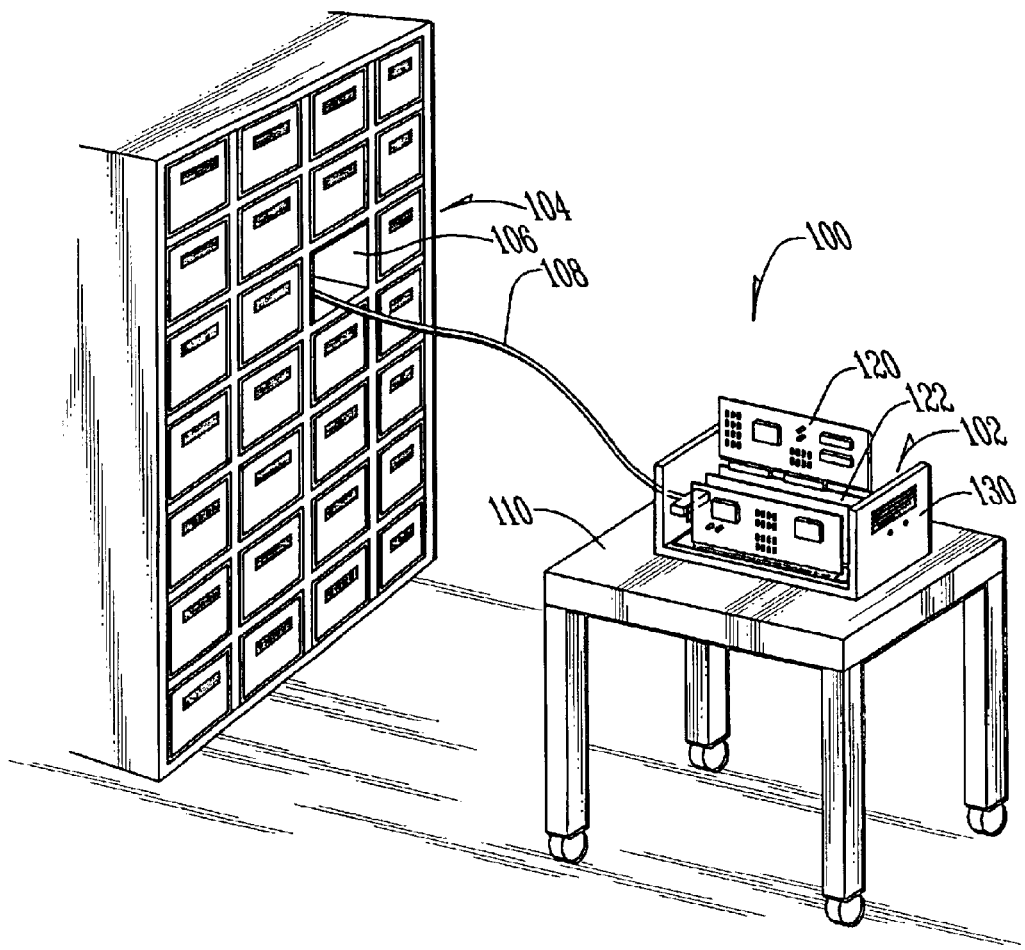
FIG. 1 is a perspective view of a system of the present invention.

Now referring to the drawings wherein like numerals refer to like matter throughout, and more specifically referring to FIG. 1, there is shown a system of the present invention generally designated 100, including an industrial PC 102, for insertion into a rack 104, having an empty slot 106 therein. PC 102 is coupled to rack 104 via cabling 108, which preferably is a special cabling used during times of repair to permit access to the PC 102 while remaining electrically connected to the rack 104 as during normal, non-repair time periods. PC 102 is shown having a circuit card 120, which may or may not be a motherboard circuit card, which is coupled to an extender card 122. Extender card 122 may be made of any suitable material used for circuit cards in PCs. PC 102 has a faceplate 130, which is viewable from the front of a repair car 110.

Figure 2:
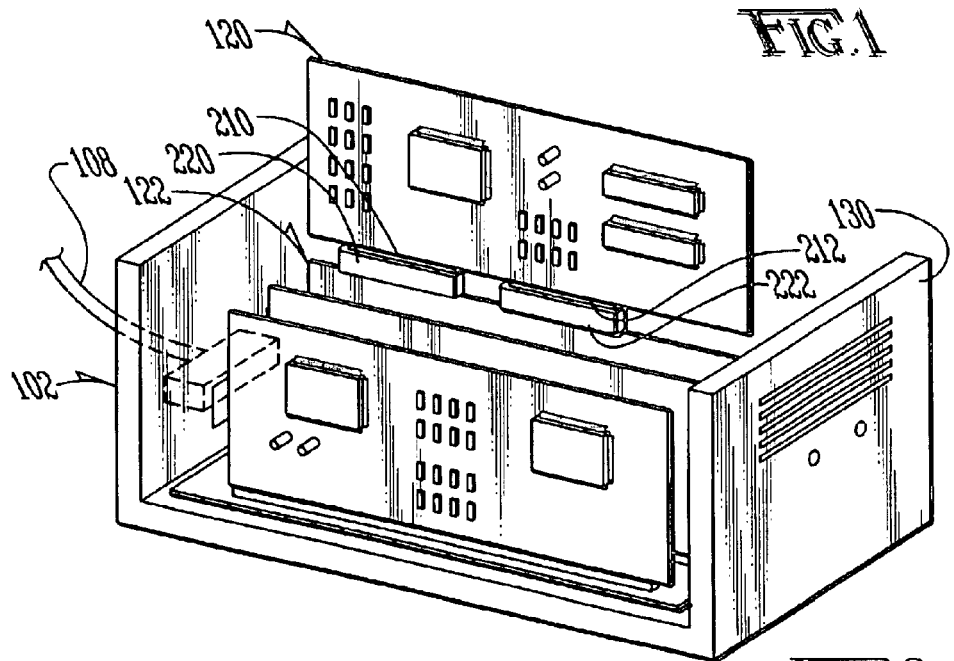
FIG. 2 is a perspective view of a partially dismantled PC, including the extender card of the present invention.

A more detailed understanding of the present invention can be achieved by now referring to FIG. 2, which shows the PC 102 with the circuit card 120 coupled through ISA and PCI connectors 210 and 212 respectively to extender card 122, having upper ISA and upper PCI connectors 220 and 222 respectively.

Figure 3:
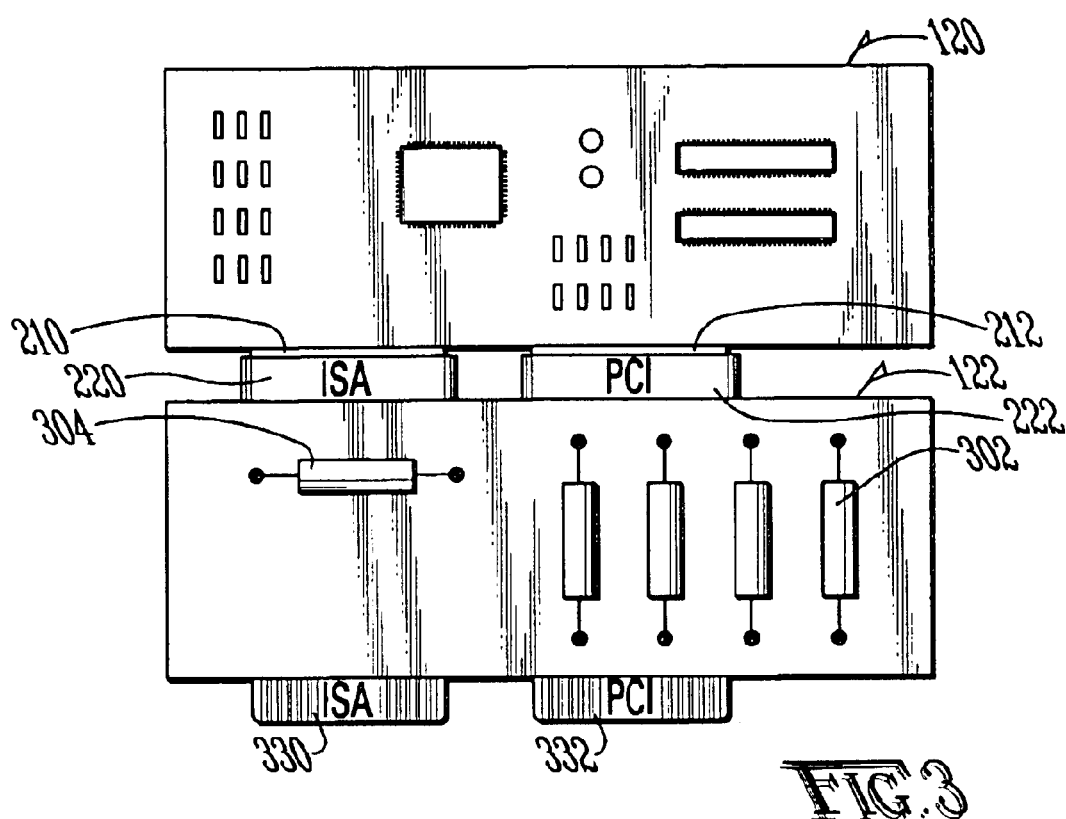
FIG. 3 is an elevational view of a combination of the extender card of the present invention and a prior art motherboard circuit card.

An even more detailed understanding of the present invention may be achieved by now referring to FIG. 3, which shows circuit card 120 having ISA and PCI bus connections 210 and 212 respectively, coupled to upper ISA and upper PCI connectors 220 and 222 respectively, located on extender card 122, which itself is coupled to the ISA and PCI buses of the PC 102 via lower ISA and lower PCI bus connectors 330 and 332 respectively. Card 120 is a preferred PICMG CPU card, which is well known in the industrial computer industry and is defined by the PCI Industrial Computer Manufacturers Group. Extender card 122 is shown having vertical current measuring device 302 and horizontal current measuring device 304. These measuring devices may be oriented in any direction and on either side of the card. These measuring devices may be as simple as conductors having a known resistance or impedance characteristic, which are then measured with an external voltmeter etc., or these measuring devices may be other known devices for measuring voltage drops or other known current measuring devices. The connectors used in the present invention are commercially available and are well known in the industry.

In operation, the apparatus and method of the present invention as described in FIGS. 1–3, could function as follows:

removing the PC 102 from slot 106 in rack 104;

coupling cabling 108 to the rack 104 and to the PC 102 to permit continued connections with the rack 104 and its associated connections;

a protective cover is removed from the PC 102 to allow access to the expansion cards therein;

a circuit card 120 having ISA and PCI bus connectors 210 and 212 respectively, is removed from the PC 102;

an extender card 122 having both lower ISA and lower PCI bus connectors 330 and 332 respectively, is placed in the slot made available by removal of circuit card 120;

circuit card 120 is coupled, via ISA and PCI bus connectors 210 and 212 respectively, to upper ISA and upper PCI connectors 220 and 222 respectively, located on extender card 122; and, current measurements are taken in current flowing through lines on extender card 122, using horizontal current measuring device 304 and vertical current measuring device 302.

Throughout this description, reference is made to an industrial PC and to a motherboard to be elevated, because it is believed that the beneficial aspects of the present invention would be most readily apparent when used in connection with industrial PCs and motherboards; however, it should be understood that the present invention is not intended to be limited to industrial PCs and motherboards and should be hereby construed to include other non-industrial PCs and non-motherboards as well.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

What is claimed is:

1. An apparatus for connecting a single circuit card to a bus connector in a PC, the apparatus comprising:

a single extender card having a top edge, a bottom edge, a front end, and a back end;

a first lower ISA bus mating connector disposed on said bottom edge of said single extender card for coupling with an ISA bus in the PC;

a first lower PCI bus mating connector disposed on said bottom edge of said single extender card for coupling with a PCI bus in the PC;

a first upper ISA connector disposed on said top edge of said single extender card for receiving the single circuit card;

a first upper PCI connector disposed on said top edge of said single extender card for receiving the single circuit card;

at least one ISA conducting line coupling the first lower ISA bus mating connector with the first upper ISA connector; and at least one PCI conducting line coupling the first lower PCI bus mating connector with the first upper PCI connector.

2. An apparatus of claim 1 further comprising a current measuring device disposed between the first lower PCI bus mating connector and the first upper PCI connector.

3. An apparatus of claim 1 wherein the current measuring device is a voltage-measuring device disposed on the ISA conducting line.

4. An apparatus of claim 1 wherein the current measuring device is a voltage-conditioning device disposed on the ISA conducting line.

5. An apparatus of claim 2 wherein the current measuring device is a resistor of a predetermined value disposed at a predetermined position in the PCI conducting line.

6. An apparatus of claim 5 wherein the resistor is disposed between two predetermined measuring terminals.

7. An apparatus of claim 6 further comprising a voltmeter coupled across and measuring a voltage drop across the two predetermined measuring terminals.

8. An apparatus of claim 6 wherein the resistor is mounted vertically.

9. An apparatus of claim 6 wherein the resistor is mounted horizontally.

10. An apparatus of claim 9 wherein the resistor is mounted in an upper portion of the single extender card.

11. A single extender card having a top edge and an opposing bottom edge and a connector along said bottom edge for coupling with a bus connector in a PC, the extender having a top card connector disposed on said top edge for receiving a single circuit card and providing at least one signal from the bus connector to the circuit card, and further having a current-measuring device thereon; and wherein the bus connector is an ISA connector and a PCI connector.

12. An extender card of claim 11 wherein the current-measuring device is a pair of terminals on the single extender card along a line having a predetermined resistance value therebetween.

13. An extender card of claim 11 wherein the current-measuring device is a voltage-conditioning device.

14. An extender card of claim 12 wherein the pair of terminals is disposed in an opposite portion of the single extender card with respect to the bottom edge.

15. A method of troubleshooting a PC comprising the steps of:

providing a PC;

removing a protective cover from the PC to allow access to expansion cards therein;

removing from the PC a single circuit card having an ISA connector and a PCI bus connector;

placing a single extender card having a top edge and an opposing bottom edge and having disposed on said bottom edge both a lower ISA connector and lower PCI bus connector in a slot made available by removal of the circuit card;

coupling the single circuit card, via ISA and PCI bus connectors, to upper ISA connector and upper PCI connector located on the top edge of the single extender card; and, making current measurements in current flowing through lines on extender card, using a current-measuring device.

16. A method of claim 15 further comprising the steps of:

removing the PC from a slot in a rack;

coupling cabling to the rack and to the PC to permit continued connections with the rack.

17. A method of claim 16 wherein the current-measuring device is a voltmeter measuring a voltage drop across two terminals on the single extender card separated by a predetermined resistance.

18. A method of claim 15 wherein the current-measuring device is a voltmeter measuring a voltage drop across two terminals on the single extender card separated by a predetermined resistance.

19. A method of claim 16 wherein the current measuring device is a voltage-conditioning device.

20. An apparatus of claim 1 wherein said single circuit card is a CPU card.

21. An extender card of claim 14 wherein said single circuit card is a CPU card.

22. A system comprising:

a rack;

a plurality of PCs disposed in and coupled to said rack, each of said PCs having a single CPU card therein having both ISA and PCI CPU bus connections thereon;

a single extender card having a bottom connection along a bottom edge for coupling with an ISA and PCI bus connection in each of said plurality of PCs; and the single extender card having a top connection along a top edge for coupling with the ISA and PCI CPU bus connections.

23. A system of claim 22 wherein the CPU card in each of said plurality of PCs is a PICMG card.

24. A system of claim 22 wherein the extender card has a current measuring device thereon.

* * * * *